United States Patent [19]

Brutosky

[11] Patent Number: 4,671,407
[45] Date of Patent: Jun. 9, 1987

[54] TRAY FOR CARD EDGE CONNECTORS

[75] Inventor: Scott A. Brutosky, Harrisburg, Pa.

[73] Assignee: AMP Incorporated, Harrisburg, Pa.

[21] Appl. No.: 875,818

[22] Filed: Jun. 18, 1986

Related U.S. Application Data

[62] Division of Ser. No. 703,794, Feb. 21, 1985, abandoned.

[51] Int. Cl.⁴ .............................................. B65D 85/38
[52] U.S. Cl. ................................... 206/332; 206/334; 206/503; 206/564; 220/20
[58] Field of Search .............................. 206/328–334, 206/564, 503; 220/20; 361/220

[56] References Cited

U.S. PATENT DOCUMENTS

| | | | |
|---|---|---|---|
| 1,946,808 | 2/1934 | Pierce | 206/338 |
| 3,017,987 | 1/1962 | Moslo | 220/82 R |
| 3,184,056 | 5/1965 | Kisor | 206/332 |
| 3,208,589 | 9/1965 | Rayburn | 206/328 |
| 3,435,949 | 4/1969 | Suverkropp | 206/332 |
| 4,171,049 | 10/1979 | Nohara et al. | 206/328 |
| 4,207,979 | 6/1980 | Brown | 206/564 |
| 4,454,949 | 6/1984 | Flum | 206/564 |
| 4,515,269 | 5/1985 | Hashimoto | 206/334 |

FOREIGN PATENT DOCUMENTS

| | | | |
|---|---|---|---|
| 0038179 | 10/1981 | European Pat. Off. | 206/328 |
| 3129138 | 3/1982 | Fed. Rep. of Germany | 206/334 |
| 3230075 | 2/1984 | Fed. Rep. of Germany | 206/328 |
| 1063347 | 3/1967 | United Kingdom | 206/509 |

Primary Examiner—Stephen Marcus
Assistant Examiner—Jimmy G. Foster
Attorney, Agent, or Firm—Allan B. Osborne

[57] ABSTRACT

A package for carrying card edge connectors and the like and for use with automatic storage and retrieval systems and with robotic-equipped insertion tools. The package includes support means for supporting connectors and spaces between the support means for receiving pins depending from the connectors.

1 Claim, 7 Drawing Figures

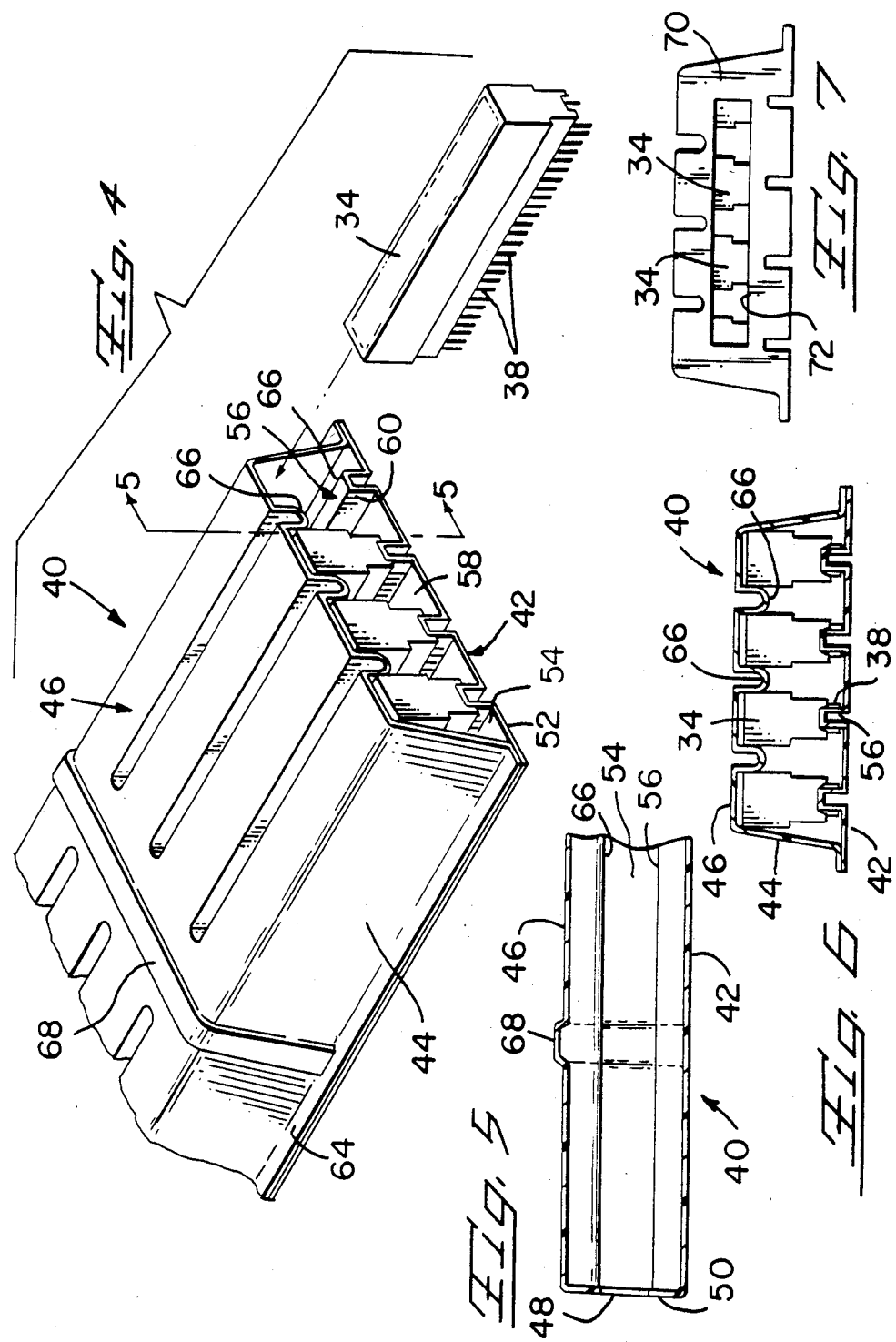

TRAY FOR CARD EDGE CONNECTORS

This is a division of application Ser. No. 703,794, filed Feb. 21, 1985, abandoned.

Until very recently, the mwethod for mounting connectors on a circuit board required a worker to first loosely position the connectors on the board; i.e., he would place the depending pins in the plated through holes in the board. The board would then be placed in an insertion tool or press and the compliant sections on the depending pins forced in the holes to securely mount the connectors. With this method, the way the connectors were stored and delivered to the work station was not of particular significance. Generally they were loaded into long cartons in a sideways fashion; i.e., the connectors were placed with the ends abutting the sidewalls. The worker simply lifted the connectors out of the carton as he needed them.

The use of robots has now changed the above-mentioned method. In its place, the following steps, very generally and broadly stated, are taken. Connectors, at the place of manufacture, are loaded into trays constructed in accordance with the embodiments of the invention disclosed herein. These trays are dimensioned and are of materials suitable for use with automatic storage and retrieval systems. The end user receives the trays in large containers from which they are removed as needed. The removed trays are placed in a feeder station in a stack. Upon receiving the appropriate signal, the bottom tray is moved into a slanted feeding position. Due to the nature of the tray, the connectors slide out of an end of the tray onto rails which lead downward to a horizontal work space. A robot arm picks up the connectors from the work space and places them onto the circuit board. The emptied tray is automatically removed from the feeder station and a filled one takes its place for unloading as required.

According to the present invention, a tray for shipping and automatic storing, retrieving and unloading electrical connectors or the like having depending pins at robotic-equipped insertion tools is disclosed. The tray includes an elongated floor having a plurality of parallel support means on which connectors, positioned end-to-end, are supported, and which define, in cooperation, spaces therebetween for receiving pins depending from such connectors. Side walls and an end wall on at least one end are also included.

For a better understanding of the invention, a description will now be provided with reference to the accompanying drawings in which:

FIG. 4 is an isometric view of another embodiment of a multiple-cavity tray;

FIG. 5 is a sectional view taken along line 5—5 in FIG. 4;

FIG. 6 is a view of FIG. 4 tray looking into the interior; and

FIG. 7 is a view of a FIG. 4 tray looking at one non-removable end wall having a window.

Figure 1:
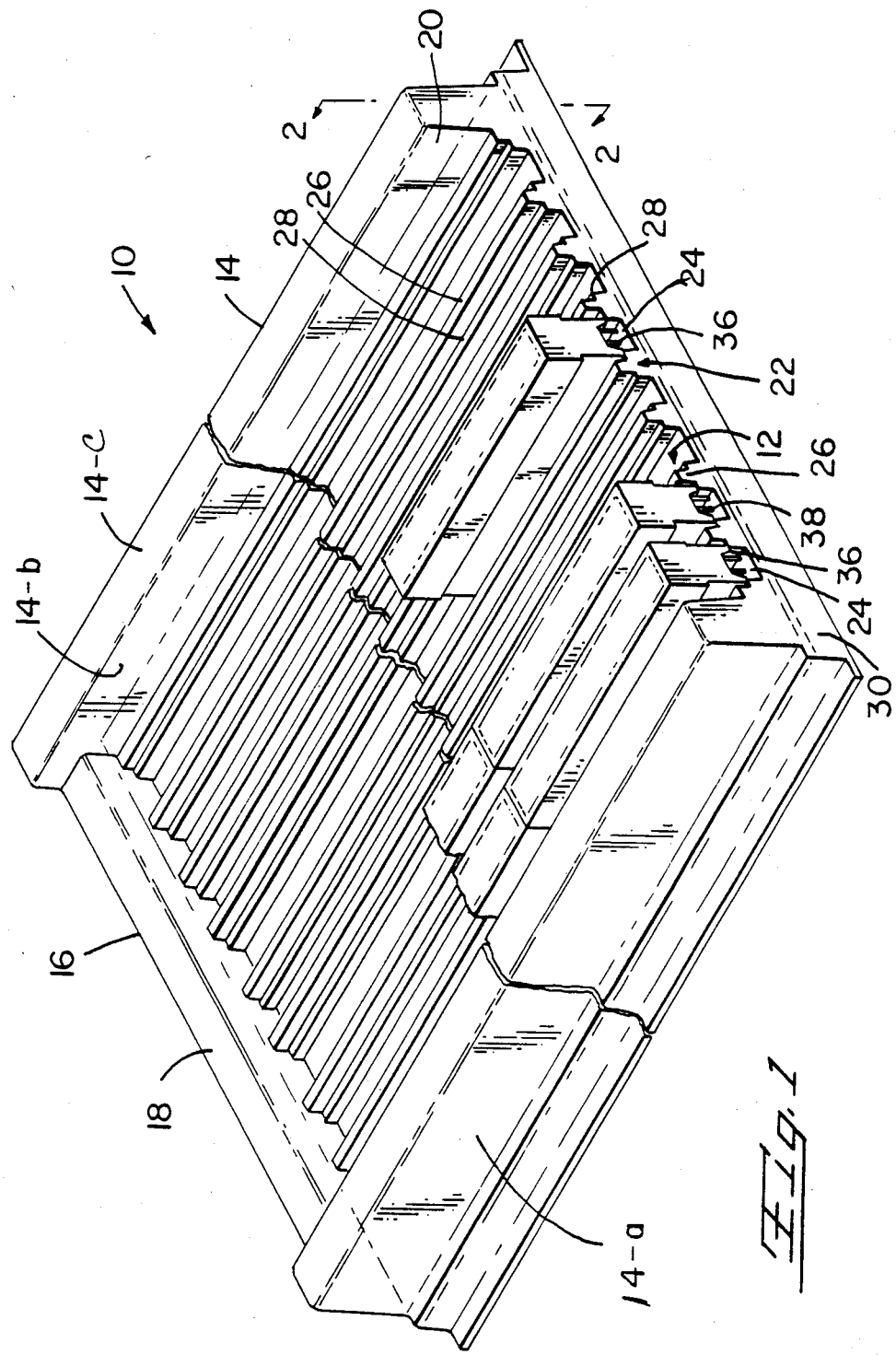
FIG. 1 is an isometric view of a multiple cavity tray constructed in accordance with the present invention.

Referring now to FIG. 1, tray 10 includes floor 12, side walls 14, and at back end 16, an end wall 18. Front end 20 is not closed off and accordingly is referred to in the alternative as open end 20.

Side walls 14 include outer wall 14-a, inner wall 14-b and top surface 14-c. The outer wall is at a slight inclination relative to the vertical with the inclination being inwardly towards the top surface. End wall 18 also includes outer wall 18-a with a like inclination, inner wall 18-b and top surface 18-c.

A plurality of parallel support means 22 extend along the length of the floor and are spaced apart a predetermined distance to define pin-receiving spaces 24 therebetween. The upper portion 26 of each support means is reduced in width to provide an upwardly facing shoulder 28 on both sides. The inside surface of each side wall includes an upwardly facing shoulder 28 also. The reduced width upper portion 26, or segment of such, is also present on each side wall.

Side walls 14 are wide and, in the preferred embodiment, hollow. Similarly, end wall 18 is relatively wide and also hollow.

Figure 2:
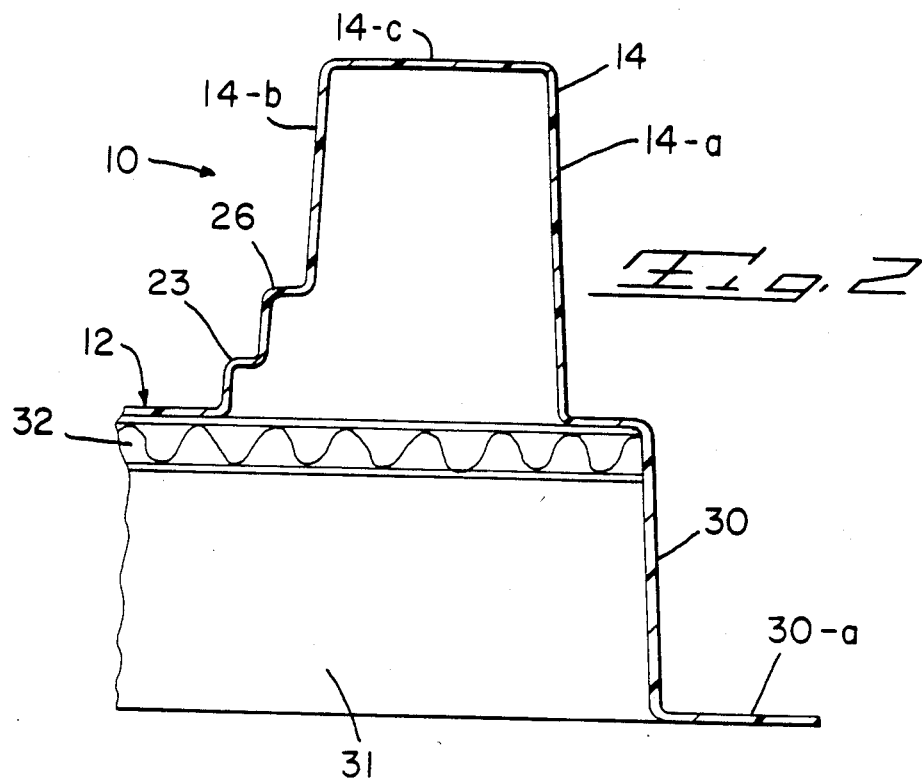
FIG. 2 is a sectional view taken along line 2—2 in FIG. 1 showing construction of the tray.

Floor 12, the support means thereon, side walls 14, and end wall 18 collectively form the upper portion of tray 10. With reference to FIG. 2 as well as FIG. 1, skirt 30 forms the lower portion of the tray and defines a downwardly open cavity 31. The skirt preferably includes a flange 30-a at the free end thereof. In the present embodiment, a stiffening member 32 is placed within the skirt and against the bottom surface or underside of floor 12. Member 32 may be a corrugated pad, as shown.

Tray 10 is vacuum formed, using clear polyvinylchloride as a material. The thickness is about 0.020 inches (0.508 mm) to provide a very lightweight tray.

Figure 3:
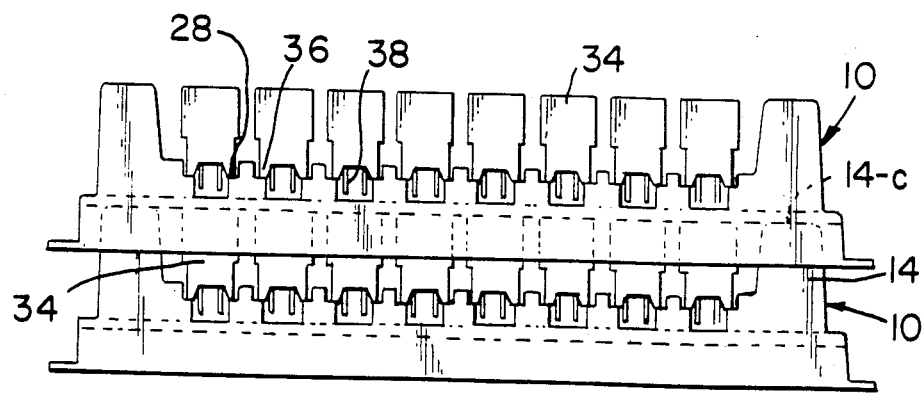
FIG. 3 is an end view of a pair of stacked trays of FIG. 1.

Tray 10 has been developed to receive card edge connectors 34, FIGS. 1 and 3, therein at the place of connector manufacture, and for use in subsequent handling, storage, shipping and unloading of the connectors at their place of use, i.e., at the press which inserts the connectors onto printed circuit boards. Further, the trays have been dimensioned and made from the abovementioned material so that they may be used in automatic storage and retrieval systems and in automatic unloading at the work station in conjunction with robotic applications.

Stackability of the trays is of primary importance. FIG. 3 shows two trays stacked one on top of the other. The side walls 14 of the lower tray fits into cavity 31 defined by skirt 30 of the upper tray due to the slight inclination of the walls and skirt mentioned above. The top surfaces 14-c of the lower tray side walls provide the support for the upper tray, as the drawing in FIG. 3 indicates.

The portion of skirt 30 extending across the front of the upper tray serves to confine connectors 34 in the lower tray. If desired, a cover formed from the lower portion of a tray can be provided for the top package in a stack.

FIGS. 1 and 3 show how connectors 34 are loaded into the tray. Shoulders 28 on adjacent support means receive the bottom edge walls 36 and depending pins 38 on the connectors extend down into pin-receiving spaces 24.

The connectors are placed end-to-end from front end 20 to back end 16. As illustrated, only edge walls 36 contact package 10, i.e., the upwardly facing shoulders 28. This feature, along with the smooth surface provided by the material used, results in the connectors sliding very freely along the shoulders under the slightest inducement such as tilt of the tray of about thirty-five degrees, more or less. The ability of the connectors to move along the shoulders and out front end 20 permits the use of automatic unloading.

One method of use is generally outlined below. None of the machinery, etc., is shown; however, those skilled in the art will readily understand. The stacked trays are placed in a feeder station at the press site. On signal from the robot (or other triggering devices), the bottom-most tray is readied for feeding by being removed from the skirt of the tray immediately above and then being tilted. The connectors slide off the support means and onto inclined rails leading to a horizontal work space. The robot picks a connector from the work space and places it on a circuit board for subsequent mounting by a connector insertion press.

FIGS. 4 through 7 illustrate another tray for similar use as package 10. Tray 40 is elongated and includes floor 42, inclined side walls 44, top wall 46 and end wall 48 (FIG. 5) at back end 50. Front end 52 of tray 40 is open. The floor and walls define tray cavity 54.

A plurality of parallel, inverted U-spaced support means 56 are provided on floor 42. The support means are spaced apart laterally to define pin-receiving spaces 58 therebetween. Each support means includes sides 60 and surface 62 connecting the sides. The support means extend from end-to-end of the tray.

The inclination of side walls 44 is inwardly from floor 42 to top wall 46. A laterally projecting flange 64 is provided where the side walls and floor meet.

Top wall 46 joins the two side walls and provides a base for spacers 66 which are on the inside surface of the wall and project into the cavity. They extend from end-to-end of the tray except for short breaks required by the presence of reinforcing member 68. Each space projects downwardly towards the center of a pin-receiving space 58, i.e., the midpoint between adjacent support means. There are no spacers between the support means adjacent side walls 44 and those side walls; the side walls provide or function as spacers.

The aforementioned reinforcing member 68 wraps around the side walls and top wall and substantially strengthens the tray.

FIG. 5 is a sectioned view showing the interior of the tray and the closed back end.

Tray 40 is vacuum formed. The material used is a polyvinylchloride and has a thickness of about 0.030 inches (0.762 mm). The length is dependent upon the facilities with which the tray is used. The method of making noted above lends itself to providing any length required.

The tray receives connectors 34 by sliding them in on surfaces 62 on support means 56 with the connector pins 38 straddling the means and extending into spaces 58. As with tray 10, the connectors are positioned on each support means end-to-end. The connectors are confined laterally by the aforementioned straddling and by spacers 66 depending from top wall 46. FIGS. 4 and 6 illustrate the loading and confining.

As with tray 10, tray 40 has been developed for use with automatic storage and retrieval systems and for automatic loading and unloading. The connectors slide very readily along surface 62 on support means 56.

FIG. 7 shows a tray 40 with an alternative end wall on the back end. This end wall, indicated by reference numeral 70, includes window 72 through which a worker can monitor the presence or absence of connectors 34 within the tray.

The open end 52 of the tray may be temporarily closed by tape or the like.

The trays described above and illustrated in the drawings were developed for use with card edge connectors. Clearly, trays can be developed using the disclosed inventive concepts for use with other kinds of connectors.

I claim:

1. A tray for supporting electrical connectors of the type having an elongated dielectric housing member with which electrical terminals are secured, the electrical terminals having terminal pins extending outwardly from a bottom surface of the housing member, said tray comprising a sheet of molded or vacuum formed plastic material and having side walls, a floor, an open end, and a closed end, said floor having thereon a plurality of spaced-apart, upwardly projecting support means extending parallel to each other from said open end to said closed end, said support means including a lower portion and an upper portion of reduced width relative to said lower portion to provide, on each side thereof, upwardly facing shoulders spaced above said floor whereby a connector, having depending terminal pins, which may be placed in said tray is positioned so that said terminal pins extend towards said floor in the space between adjacent support means and the two shoulders on respective support means extending alongside that space receives a respective edge of said connector, said tray further having closure means attached to and extending downwardly from the floor adjacent said open end, said closure means being adapted to extend over the open end of a like tray on which said tray may be stacked.

* * * * *